United States Patent
Abe et al.

(10) Patent No.: US 10,825,895 B2
(45) Date of Patent: Nov. 3, 2020

(54) NITRIDE SEMICONDUCTOR SUBSTRATE

(71) Applicant: CoorsTek KK, Shinagawa-ku, Tokyo (JP)

(72) Inventors: Yoshihisa Abe, Hadano (JP); Kenichi Eriguchi, Hadano (JP); Jun Komiyama, Hadano (JP)

(73) Assignee: COORSTEK KK, Shinagawa-Ku, Tokyo (JP)

(*) Notice: Subject to any disclaimer, the term of this patent is extended or adjusted under 35 U.S.C. 154(b) by 0 days.

(21) Appl. No.: 16/597,096

(22) Filed: Oct. 9, 2019

(65) Prior Publication Data

US 2020/0194545 A1    Jun. 18, 2020

(30) Foreign Application Priority Data

Dec. 12, 2018 (JP) .................. 2018-232148
Jul. 8, 2019 (JP) .................. 2019-126583
Sep. 19, 2019 (JP) .................. 2019-170218

(51) Int. Cl.
*H01L 29/06* (2006.01)
*H01L 29/36* (2006.01)
(Continued)

(52) U.S. Cl.
CPC ........ *H01L 29/0615* (2013.01); *H01L 29/201* (2013.01); *H01L 29/2003* (2013.01);
(Continued)

(58) Field of Classification Search
CPC . H01L 29/0615; H01L 29/2003; H01L 29/36; H01L 29/66431; H01L 29/66439;
(Continued)

(56) References Cited

U.S. PATENT DOCUMENTS 10,186,588 B1 * 1/2019 Kato .................. H01L 29/207
2011/0062556 A1    3/2011 Komiyama et al.
2011/0298009 A1 * 12/2011 Ikuta ................. H01L 21/02381
                                                     257/190

FOREIGN PATENT DOCUMENTS

JP    2014017422 A    1/2014
JP    2016219690 A    12/2016

OTHER PUBLICATIONS

Office Action dated Aug. 3, 2020, by the Taiwanese Patent Office in corresponding Taiwanese Patent Application No. 108136477 (4 pages).

* cited by examiner

*Primary Examiner* — Feifei Yeung Lopez
(74) *Attorney, Agent, or Firm* — Buchanan, Ingersoll & Rooney PC

(57) ABSTRACT

A nitride semiconductor substrate can effectively reduce leakage current in the vertical direction. The nitride semiconductor substrate comprises a buffer layer and an operation layer, both of which are made of nitride semiconductor, deposited on a silicon single crystal substrate, wherein the buffer layer comprises a single-layered first initial layer in contact with the silicon single crystal layer, and a single-layered second initial layer in contact with the first initial layer, the first initial layer is made of AlN, the second initial layer is made of $Al_zGa_{1-z}N$ ($0.12 \le z \le 0.65$), and in an X-Y graph where the X-axis denotes $z \times 100$ and the Y-axis denotes carbon concentration in the second initial layer, X ranges from 12 to 65 and Y is within a range between $Y=1E+17 \times \exp(-0.05 \times X)$ and $Y=1E+21 \times \exp(-0.05 \times X)$.

1 Claim, 1 Drawing Sheet

(51) Int. Cl.
*H01L 29/20* (2006.01)
*H01L 29/207* (2006.01)
*H01L 29/66* (2006.01)
*H01L 29/778* (2006.01)
*H01L 29/201* (2006.01)
*H01L 29/205* (2006.01)

(52) U.S. Cl.
CPC .......... *H01L 29/205* (2013.01); *H01L 29/207* (2013.01); *H01L 29/36* (2013.01); *H01L 29/66431* (2013.01); *H01L 29/66439* (2013.01); *H01L 29/66462* (2013.01); *H01L 29/778* (2013.01); *H01L 29/7786* (2013.01)

(58) Field of Classification Search
CPC . H01L 29/778; H01L 29/7786; H01L 29/201; H01L 29/205; H01L 29/207; H01L 29/66462
See application file for complete search history.

NITRIDE SEMICONDUCTOR SUBSTRATE

BACKGROUND OF THE INVENTION

Field of Invention

The present invention relates to a nitride semiconductor substrate to be used for high speed and high withstand voltage devices, and in particular, to a nitride semiconductor substrate in which gallium nitride (GaN) is deposited on a different type substrate made of silicon (Si).

Description of the Related Art

A nitride semiconductor substrate in which GaN is deposited on a Si single crystal substrate is normally produced by metal organic chemical vapor deposition (MOCVD). In this method, the technique of forming an initial layer comprising aluminum nitride (AlN) layer and aluminum gallium nitride (AlGaN) layer on a Si single crystal is known to the public.

JP 2014-17422 A discloses a compound semiconductor device including a first buffer layer of AlN material and a second buffer layer of AlGaN material on a Si substrate, where the second buffer layer has higher carbon concentrations as it rises from the bottom to the top of the surface. The compound semiconductor device can attain the high withstand voltage by suppressing an off-leak current while keeping good crystallinity of the compound semiconductor and suppressing current collapse.

JP 2016-219690 A discloses formation of an initial nucleation layer 2, as an example of producing a group 13 nitride semiconductor substrate, a method of the formation comprising steps of; placing a boron-doped 6-inch silicon single crystal substrate with a principal plane of (111) and a specific resistance of 0.004 Ωcm, or a base substrate 1, on an MOCVD apparatus; vapor depositing a 100 nm-thick AlN single crystal layer with a carbon concentration of $1\times10^{18}$ atoms/cm$^3$ by using trimethylaluminum (TMA) and ammonia (NH$_3$) as source gases; and further, by setting a base growth temperature at 1000° C. with slight adjustments in a range of 1 to 15° C. in all the following processes for formation of group 13 nitride semiconductor layers, vapor depositing a 300 nm-thick Al$_x$Ga$_{1-x}$N (x=0.1) single crystal layer with a carbon concentration of $5\times10^{19}$ atoms/cm$^3$ by using trimethylgallium (TMG), TMA and NH$_3$ as source gases.

While the higher the temperature of an AlN layer first formed on a Si single crystal substrate, the better the crystal quality such as high crystallinity and good surface flatness can be obtained, etching on the Si proceeds quickly, and consequently the rate of forming the AlN layer is normally limited. This may make it difficult to ensure the sufficient surface flatness of the AlN layer.

Poor flatness of the AlN layer causes disorder of a superlattice structure of (Al)GaN and AlN exerting an effect on stress control and raises a problem that the stress goes out of control.

In order to flatten the rough surface of the AlN layer, an AlGaN layer is commonly deposited thereon. The AlGaN layer is expected not only to flatten the film but also to have high resistivity, when the application to the lateral semiconductor device is considered.

AlN has a wider band gap and much higher resistance than GaN has. But since the AlGaN layer includes some GaN component, AlGaN has a slightly narrower band gap and lower resistance than AlN has. The AlGaN layer has a lot of dislocations in its crystal because it is positioned close to the Si single crystal substrate; the dislocations cause the lowering of resistance.

For this problem, doping of impurities such as carbon which can compensate electrons is used to increase resistance. However, doping of high-concentration carbon may cause deterioration of crystal quality. Therefore, the AlGaN layer needs to have appropriate Al composition so that its band gap becomes wide enough to where doping of high-concentration carbon is not needed.

However, it is hard to say that the relationship between the Al composition and the carbon concentration in the AlGaN layer is technically established. In JP 2014-17422 A, for example, an Al$_x$Ga$_{1-x}$N layer has a thickness of about 200 nm, about $0.8 \leq x \leq 0.9$ (for example, x=0.9), and a carbon concentration of about $5\times10^{17}$/cm$^3$ to $3\times10^{18}$/cm$^3$ (for example, $1\times10^{18}$/cm$^3$). However, the leakage current toward the Si single crystal substrate has yet to be sufficiently reduced in the AlGaN layer.

JP 2016-219690 A uses a Al$_x$Ga$_{1-x}$N (x=0.1) single crystal layer having a carbon concentration of $5\times10^{19}$ atoms/cm$^3$ and a thickness of 300 nm. In this case, however, the carbon concentration is too high to sufficiently secure crystallinity of the AlGaN layer.

SUMMARY OF THE INVENTION

In response to the above issue, an object of the present invention is to provide a highly crystalline nitride semiconductor substrate with reduced leakage in the vertical direction when it is used as a lateral semiconductor device. Especially in the nitride semiconductor substrate in which GaN is deposited on the Si single crystal substrate, it is characteristic that the condition to form the initial AlGaN layer is suitably controlled and that Al compositions and concentrations of carbon impurities are within certain ranges.

The nitride semiconductor substrate of the present invention comprises a buffer layer and an operation layer, both of which are formed of nitride semiconductor, deposited sequentially on a silicon single crystal substrate, wherein the buffer layer comprises a single-layered first initial layer formed in contact with the silicon single crystal substrate and a single-layered second initial layer formed in contact with the first initial layer, the first initial layer is formed of AlN, the second initial layer is formed of Al$_z$Ga$_{1-z}$N ($0.12 \leq z \leq 0.65$), and in an X-Y graph where the X-axis denotes z×100 and the Y-axis denotes carbon concentration in the second initial layer, X ranges from 12 to 65 and Y is within a range between Y=1E+17×exp(−0.05×X) and Y=1E+21×exp(−0.05×X).

By said constitution, especially in case GaN is deposited on the Si single crystal substrate, the nitride semiconductor substrate enables leakage in the vertical direction to reduce when it is used as a lateral semiconductor device.

It is preferable that the buffer layer should further comprise a layer in contact with the second initial layer, the layer being formed of Al$_{c1}$Ga$_{1-c1}$N, and in an X-Y graph where the X-axis denotes c1×100 and the Y-axis denotes carbon concentration in a layer in contact with the second initial layer, X ranges from 0 to 20 and Y is a range between Y=8E+18×exp(−0.03×X) and Y=4E+20×exp(−0.03×X).

The carbon concentration of the layer in contact with the second initial layer is preferably lower than that of the second initial layer.

According to the present invention, when the group III nitride semiconductor film is used as a lateral semiconductor device, leakage in the vertical direction is suppressed by properly adjusting the condition to form the second initial layer and thereby controlling Al compositions and concentrations of carbon impurities to be within certain ranges; this achieves a high withstand voltage. The second initial layer has high crystallinity, so the nitride semiconductor layer formed thereon is also of high quality.

DESCRIPTION OF THE PREFERRED EMBODIMENTS

The nitride semiconductor substrate of the present invention will be described in detail with reference to the drawings. The nitride semiconductor substrate comprises a buffer layer and an operation layer, both of which are composed of nitride semiconductor, deposited sequentially on a silicon single crystal substrate, wherein the buffer layer comprises a single-layered first initial layer formed in contact with the silicon single crystal layer and a single-layered second initial layer formed in contact with the first initial layer, the first initial layer is composed of AlN, the second initial layer is composed of $Al_zGa_{1-z}N$ ($0.12 \leq z \leq 0.65$), and in an X-Y graph where the X-axis denotes $z \times 100$ and the Y-axis denotes carbon concentration in the second initial layer, X ranges from 12 to 65 and Y is within a range between $Y=1E+17 \times \exp(-0.05 \times X)$ and $Y=1E+21 \times \exp(-0.05 \times X)$.

Figure 1:
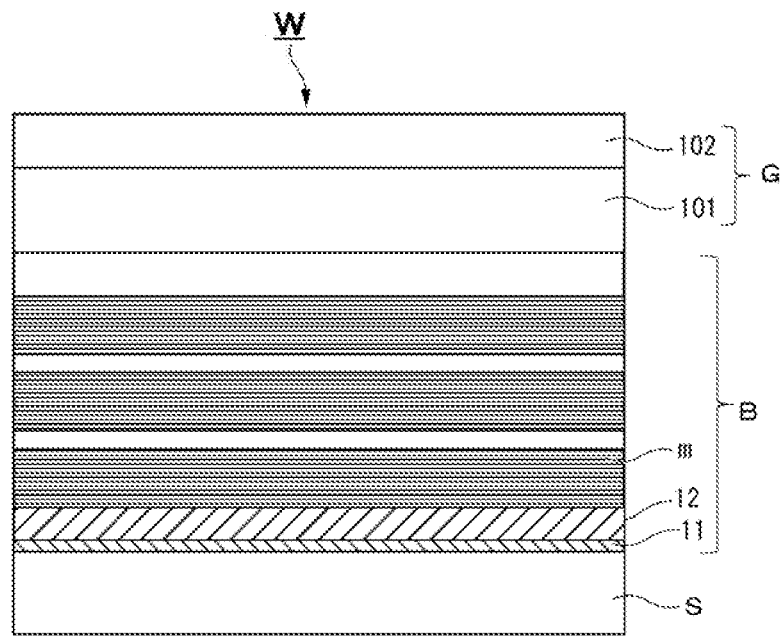
FIG. 1 is a cross-sectional schematic diagram showing one embodiment of the nitride semiconductor substrate of the present invention.

FIG. 1 is a cross-sectional schematic diagram showing one embodiment of the nitride semiconductor substrate of the present invention. Description for a HEMT structure is provided herein. That is to say, in the nitride semiconductor substrate W, the buffer layer B is deposited on one principal surface of the base substrate S and the operation layer G is formed thereon.

In the schematic diagrams shown in the present invention, shapes are schematically simplified and emphasized for explanation, and the shapes, dimensions, and ratios of details are different from the actual shapes, dimensions, and ratios. The same reference numerals in the configuration will be omitted, and further other configurations which are unnecessary to explain the present invention will not be described.

In the present invention, the base substrate S is made of silicon single crystal. Because the layer which is firstly formed on a different type substrate is selected or designed, taking characteristics of the different type substrate into consideration, the other physical properties of the base substrate S are not particularly limited.

For example, the kind and the concentration of impurities contained in the Si single crystal, carbon concentration, nitrogen concentration, oxygen concentration, defect density, and methods of preparing Si single crystal are arbitrarily selected depending on requested specifications. The face on which the nitride semiconductor substrate layer is formed may have an off angle of −4° to 4°.

The buffer layer B has a structure in which a plurality of nitride semiconductor layers are stacked, which can be formed by known methods in accordance with application or purpose. The one as described for example in JP 2016-219690 A is preferred, in which the appropriate initial layer is firstly formed and then one or more nitride semiconductor layers having compositions and concentrations of impurities different from each other are deposited thereon.

Here, the nitride semiconductor includes a combination of elements of group 13, such as Ga, Al and indium (In) and elements of group 15, such as nitrogen.

The operation layer G is a general term for layers working as a device and some layers formed thereon. In a High Electron Mobility Transistor (HEMT) shown in FIG. 1, the electron transit layer 101 and the electron supply layer 102 correspond to the operation layer G. Further, cap layers made of GaN etc., may be formed thereon.

The use for the nitride semiconductor substrate W does not need to be limited, and is particularly suitable for power devices which are capable of achieving high frequency and high withstand voltage.

In the present invention, the buffer layer B includes a single-layered first initial layer formed in contact with the silicon single crystal layer, and a single-layered second initial layer formed in contact with the first initial layer. In other words, the single-layered first initial layer 11 and the single-layered second initial layer 12 are stacked on the upper surface of the base substrate S in this order.

The first initial layer 11 is made of AlN. The first initial layer 11 in the present invention has a role known in the prior art, that is to say, a role to avoid direct reaction of Si and Ga. The only thing the first initial layer 11 has to do is to at least work as a layer right above the Si single crystal. The first initial layer 11 may be made of not only AlN whose Al ratio is 100% but also AlGaN whose Al ratio is less than an AlN ratio of 100% by 2 to 3%.

For a similar reason as above, the first initial layer 11 does not need to be a monolayer in the true sense and may include some composition gradients. At the time of consecutively forming the layer by MOCVD method, some elements, such as Si, Ga and C which inevitably get into the layer may exist, as long as they do not impair the effect of the present invention.

The thickness of the first initial layer 11 is approximately 40 to 150 nm, and preferably 80 to 120 nm, but not limited thereto.

The second initial layer 12 is made of $Al_zGa_{1-z}N$ ($0.12 \leq z \leq 0.65$), whose purpose is to flatten the rough surface of the first initial layer 11. Formation of the first initial layer 11 and the second initial layer 12 leads to improvement of crystallinity due to reduction of dislocation density etc., and suppression of warping due to thickening of the layer.

When the Al ratio z in the second initial layer 12 is more than 0.65, the second initial layer 12 may be difficult to have good surface flatness. On the other hand, when z is less than 0.12, the difference in the lattice constant with the first initial layer 11 becomes too large, which may cause generation of a lot of dislocations and cracks.

The thickness of the second initial layer 12 is also approximately 50 to 450 nm, and preferably 200 to 350 nm, but not limited thereto.

Similarly to the first initial layer 11, the second initial layer 12 does not need to be a monolayer in the true sense and may include some composition gradients.

In the second initial layer 12, in an X-Y graph where the X-axis denotes $z \times 100$ and the Y-axis denotes carbon concentration in the second initial layer, X ranges from 12 to 65 and Y is within a range between $Y=1E+17 \times \exp(-0.05 \times X)$ and $Y=1E+21 \times \exp(-0.05 \times X)$.

Figure 2:
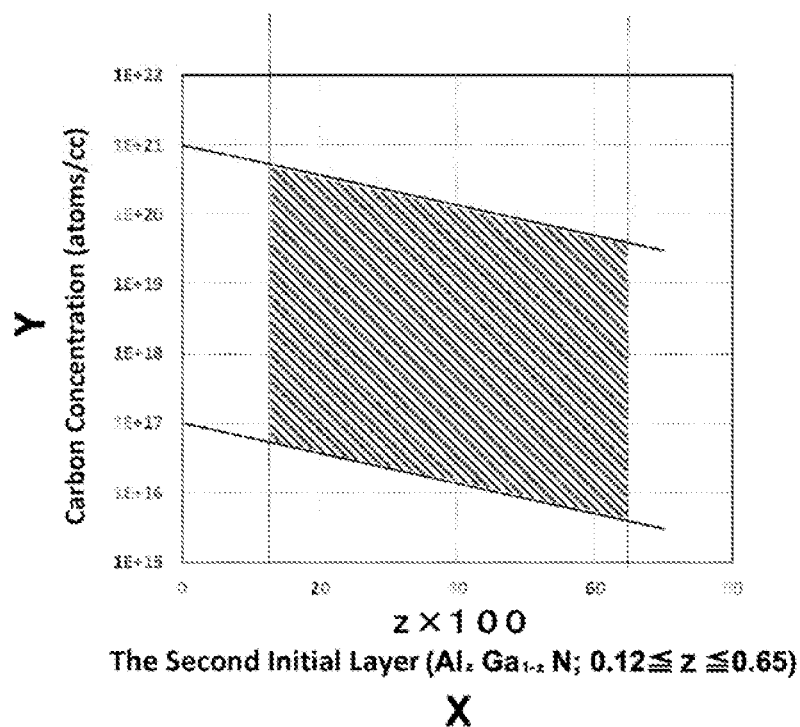
FIG. 2 is a graph showing the relationship between Al compositions and concentrations of carbon impurities in the second initial layer in the nitride semiconductor substrate of the present invention.

FIG. 2 is a graph showing the relationship between Al composition and concentration of carbon impurities in the second initial layer 12. When the relationship between z in $Al_zGa_{1-z}N$ (0.12≤z≤0.65) and the carbon concentration in the second initial layer 12 is in a range of X=12, X=65, Y=1E+17×exp(−0.05×X), and Y=1E+21×exp(−0.05×X), remarkable effects of the present invention are obtained.

The present invention makes the relationship between the Al ratio and the carbon concentration clear on the ground that the second initial layer 12 would best have the appropriate Al composition to widen its band gap instead of being doped with high concentration carbon. When the relationship is within the foregoing range, it contributes to both crystallinity and high resistance in the second initial layer 12.

Such carbon concentration can have a desired value under control of growth temperature and growth pressure as a known technique in the metal organic chemical vapor deposition (MOCVD), for example. The Al ratio z can be also controlled by flow rate and supply time of source gases.

Hereinafter, a further preferable embodiment of the present invention will be described. The preferable relationship between the Al ratio z and the carbon concentration in the second initial layer 12 is that in an X-Y graph, X ranges from 26 to 45 and Y is within a range between Y=7E+17×exp(−0.05×X) and Y=1E+19×exp(−0.05×X). It can be said that this embodiment puts an emphasis on the crystal quality because the range above is where the carbon concentration is kept lower.

To form the second initial layer 12, when the Al ratio is set high in the early stage of formation and then is set to be lower as the layer is grown, the former half region in the layer can have emphasis on crystallinity and the latter half region in the layer can have emphasis on withstand voltage. Therefore, the advantage of the present invention can be further effectively obtained without increasing the thickness of the second initial layer 12 unduly.

The buffer layer B may have a multilayer buffer layer m in addition to the first initial layer 11 and the second initial layer 12. In one example, the multilayer buffer layer m has a multilayered structure in which the $Al_cGa_{1-c}N$ (0≤c≤0.8) single crystal layer with a thickness of 15 to 50 nm and the AlN layer with a thickness of 3 to 10 nm are stacked alternatively and repeatedly so that the multilayered structure can have a total thickness of about 500 to 2000 nm. Stress on the buffer layer B can be effectively relaxed by further having such multilayer structure m.

The operation layer G has a layered structure comprising the electron transit layer 101 and the electron supply layer 102. Other layers, such as cap layers and passivation layers may be put on the operation layer G in accordance with purpose and use. The thicknesses of the electron transit layer 101 and the electron supply layer 102 are known value.

Each layer of the nitride semiconductor substrate W of the present invention is typically formed by epitaxial deposition growth. The deposition is performed by common methods, such as CVD methods represented by MOCVD and plasma CVD (PECVD), laser beam vapor deposition method, sputtering method in atmosphere gases, molecular beam epitaxy (MBE) using molecular beam under high vacuum, metal-organic molecular beam epitaxy (MOMBE) which combines MOCVD with MBE. Materials for epitaxial growth are not limited to the ones used in the Examples. Source gas for carbon addition may include not only trimethylaluminum (TMAl) and trimethylgallium (TMGa) but also triethylaluminum (TEAl) and triethylgallium (TEGa).

As described above, the nitride semiconductor substrate of the present invention shows a superior withstand voltage because the leakage in the vertical direction is enabled to reduce when it is used as a lateral semiconductor device. The nitride semiconductor layer formed thereon is also of high quality as the second initial layer has excellent crystal quality.

EXAMPLES

The present invention will be described in detail with reference to examples but the present invention will not be restricted to the examples.

Example 1

A 6-inch Si single crystal wafer as a base substrate S was placed in an MOCVD apparatus, and was annealed in a hydrogen atmosphere at a pressure of 135 hPa and at a substrate temperature of 950° C. to remove a natural oxide film on the silicon surface and to develop atomic steps of silicon. The substrate temperature was set at 1020° C., and then TMAl and ammonia ($NH_3$) were supplied to form 100 nm-thick AlN as the first initial layer 11. Thereafter, TMGa was added to form 200 nm-thick $Al_zGa_{1-z}N$ (z=0.3) as the second initial layer 12. Next, a multilayer buffer layer m was formed by alternatively depositing eighty layers each of which is $Al_{0.1}Ga_{0.9}N$ and AlN, as a stress control layer. After that, a 1400 nm-thick non-doped GaN layer as the electron transit layer 101 and a 20 nm-thick $Al_{0.25}Ga_{0.75}N$ layer as the electron supply layer 102 were deposited in this order, which were supposed to give the operation layer G, to give a sample.

Examples 2 to 5

Samples of Examples 2 to 5 were prepared in a manner similar to Example 1 except that carbon concentrations were controlled mainly by the deposition pressure and the Al ratio z was controlled by the flow rate of TMAl and TMGa.

Comparative Example 1

A sample was prepared in a manner similar to Example 1 except that the substrate temperature was set at 920° C.

The concentration of carbon impurities in the sample was 5E+20 $cm^{-3}$. It is assumed that too much amount of carbon impurities caused degradation of the crystal quality.

Comparative Example 2

A sample was prepared in a manner similar to Example 1 except that the substrate temperature was set at 1020° C.

The concentration of carbon impurities in the sample was 1E+16 $cm^{-3}$. It is assumed that the sample of Comparative Example 2 could not have sufficient resistance because the amount of carbon impurities was too little.

Comparative Example 3

A sample was prepared in a manner similar to Example 1 except that z in $Al_zGa_{1-z}N$ was set not at z=0.3 but at z=0.11.

The concentration of carbon impurities in the sample was 5E+17 $cm^{-3}$. It is assumed that because of the low Al composition, the band gap was not sufficiently secured, and that because of the insufficient concentration of carbon impurities, the resistance did not increase.

Comparative Example 4

A sample was prepared in a manner similar to Example 1 except that z in $Al_zGa_{1-z}N$ was set not at z=0.3 but at z=0.7.

The concentration of carbon impurities in the sample was 1E+20 $cm^{-3}$. It is assumed that although the sample of Comparative Example 4 had a high Al composition and a wide band gap, the crystal quality was poor because the concentration of carbon impurities was too high.

When the Al composition was more than 70%, namely z>0.7, the second initial layer 12 could hardly have surface smoothness.

Example 6

In Example 6, the Al ratio was set at 0.35 at first and then was gradually lowered as the layer was formed so that the Al ratio finally could be 0.25 when the second initial layer 12 was formed. The layer thickness was set at 50 nm. The others were conducted in a manner similar to Example 1.

[Evaluation 1: Carbon Concentration]

The carbon concentration in the second initial layer 12 of each sample was measured by secondary ion mass spectrometry (SIMS).

[Evaluation 2: Leakage Current in the Vertical Direction]

A strip-shaped test piece with a width of 20 mm was cut from the center part to the edge part of the substrate main surface of each sample. Next, the electron supply layer 102 and the electron transit layer 101 of the test piece were partly removed by dry etching. A 10 $mm^2$-sized Au electrode was vacuum deposited on the surface exposed by the dry etching to form a Schottky electrode. To compare the current values at 600V, by conducting electricity on the Si single crystal substrate side, using a commercially available curve tracer, I-V characteristic was measured. When the current value was 1E−8 (A) or less, the sample was judged to be passed.

[Evaluation 3: Crystallinity]

The full width at half maximum of the rocking curve in X-ray diffraction was measured for (002) plane of the second initial layer 12 of each sample. 2000 arcsec or less was judged to be passed.

Table 1 summarizes the preparation conditions and the evaluation results of each sample.

TABLE 1

| | z | Carbon Concentration (atoms/cc) | Leakage Current Evaluation | Full Width at Half Maximum (arcsec) | Special Remarks |
|---|---|---|---|---|---|
| Ex. 1 | 0.3 | 1.00E+18 | Good | 1500 | FWHM values were all approximately ≤2000 arcsec. Good. |
| Ex. 2 | 0.12 | 1.00E+18 | Good | 1850 | |
| Ex. 3 | 0.65 | 5.00E+19 | Good | 1700 | |
| Ex. 4 | 0.26 | 1.00E+19 | Good | 1600 | |
| Ex. 5 | 0.45 | 5.00E+18 | Good | 1550 | |
| Ex. 6 | 0.35 to 0.25 | 5.00E+18 | Good | 1400 | Characteristic equal to or greater than 100 nm as used in Ex. 1 was achieved at a thickness of 50 nm. |
| Comp. Ex. 1 | 0.3 | 5.00E+20 | Good | 2300 | FWHM value was >2000 arcsec, suggesting poor crystallinity. |
| Comp. Ex. 2 | 0.3 | 1.00E+16 | Not good | 1600 | Withstand voltage defect |
| Comp. Ex. 3 | 0.11 | 5.00E+17 | — | — | Evaluation was impossible due to generation of cracks. |
| Comp. Ex. 4 | 0.7 | 1.00E+20 | — | — | Evaluation was impossible due to great deterioration of flatness. |

From the results of Table 1, those within the scope of the present invention were good in both withstand voltage (leakage current in the vertical direction) and crystallinity (the full width at half maximum in the second initial layer 12). The sample in Example 6 was excellent both in crystallinity and withstand voltage as compared with those of Examples 1 to 5.

Hereinafter, there is also a more preferred range of a layer $m_0$ ($Al_{c1}Ga_{1-c1}N$, not shown in the figure) formed in contact with the second initial layer. That is to say, in an X-Y graph, X (c×100) ranges from 0 to 20, and Y (the carbon concentration in the layer $m_0$ formed in contact with the second initial layer) is within a range between $Y=8E+18\times exp(-0.03\times X)$ and $Y=4E+20\times exp(-0.03\times X)$.

By doing so, the nitride semiconductor substrate of the present invention was found to achieve in both higher crystallinity and higher withstand voltage. Samples for Examples 7 to 9 hereinafter were prepared by controlling c1 of the layer $m_0$ formed in contact with the second initial layer and concentrations of carbon contained therein. The leakage current and the full width at half maximum (crystallinity) were evaluated in a manner similar to Example 1.

Example 7

Example 7 used a sample having C1=0 and a carbon concentration of 7E+19 $cm^{-3}$.

The sample was superior to that of Example 2 in regard to slightly less leakage current. The full width at half maximum was 1860 arcsec, however, and because of the relatively high carbon concentration, the crystallinity was slightly poorer than that of Example 2 with 1850 arcsec. In light of both crystallinity and withstand voltage, the sample has better characteristics in comparison with that of Example 2.

Example 8

Example 8 used a sample having C1=0.1 and a carbon concentration of 5E+19 cm$^{-3}$.

The sample was superior to that of Example 1 in regard to slightly less leakage current. However, the full width at half maximum was 1480 arcsec, being slightly better than 1500 arcsec in Example 1. Accordingly, both crystallinity and withstand voltage are superior to those of Example 1.

Example 9

Example 9 used a sample having C1=0.2 and a carbon concentration of 1E+20 cm$^{-3}$.

The sample was superior to that of Example 4 in regard to slightly less leakage current. The full width at half maximum was 1450 arcsec, being slightly better than 1480 arcsec in Example 8, to say nothing of 1600 arcsec in Example 4. Accordingly, both crystallinity and withstand voltage are superior to those of Example 4.

As described above, in the more preferred embodiment, the present invention can provide a relatively excellent nitride semiconductor substrate if its goal is to achieve both crystallinity and withstand voltage at a higher standard.

Especially preferred is an embodiment where the carbon concentration of the layer $m_0$ formed in contact with the second initial layer is lower than that of the second initial layer 12. Since carbon exists as impurities in the nitride semiconductor, when its concentration becomes higher, crystallinity of the nitride semiconductor tends to deteriorate. Since the carbon concentration of the second initial layer 12 is set to be relatively high, in case the carbon concentration of the layer $m_0$ subsequently formed in contact with the second initial layer is about on a same level, the multilayer m as a whole would grow without much improving its crystallinity.

In the present invention, as described above, by making the carbon concentration of the layer $m_0$ formed in contact with the second initial layer lower than that of the second initial layer 12, the layer $m_0$ can match the second initial layer 12, or a feature of the present invention, which enables crystallinity of the multilayer buffer layer m to improve further in an easy to produce manner.

Example 10

In the sample of Example 4, the carbon concentration of the layer $m_0$ formed in contact with the second initial layer was 1E+19 cm$^{-3}$, which was approximately equal to that of the second initial layer 12. Whereas, in the sample of Example 10, in light of optimization of the preparation condition, the carbon concentration of the layer $m_0$ formed in contact with the second initial layer was set at 9E+18 cm$^{-3}$ that was lower than a carbon concentration of 1E+19 cm$^{-3}$ in the second initial layer 12. Except for this, a sample was prepared in a manner similar to Example 4.

As a result, the leakage current of Example 10 was about the same as that of Example 4. The additional evaluation further showed that the multilayer buffer layer m in the sample of Example 10 had 10% less full width at half maximum than that of Example 4 and had excellent crystallinity, when compared with the sample of Example 4. It is assumedly because by reducing the concentration of impurity carbon, crystallinity of the layer $m_0$ formed in contact with the second initial layer becomes relatively high and crystallinity of the multilayer buffer layer m deposited thereon is also similarly improved.

What is claimed is:

1. A nitride semiconductor substrate comprising a buffer layer and an operation layer, both of which are made of nitride semiconductor, sequentially deposited on a silicon single crystal substrate, wherein
   the buffer layer comprises a single-layered first initial layer formed in contact with the silicon single crystal layer, a single-layered second initial layer formed in contact with the first initial layer, and a layer formed in contact with the second initial layer,
   the first initial layer is made of AlN,
   the second initial layer is made of $Al_zGa_{1-z}N$ (0.12≤z≤0.65), and in an X-Y graph where the X-axis denotes z×100 and the Y-axis denotes carbon concentration in the second initial layer, X ranges from 12 to 65 and Y is within a range between Y=1E+17×exp(−0.05×X) and Y=1E+21×exp(−0.05×X),
   the layer formed in contact with the second initial layer is made of $Al_{c1}Ga_{1-c1}N$, and in an X-Y graph where the X-axis denotes c1×100 and the Y-axis denotes carbon concentration in the layer formed in contact with the second initial layer, X ranges from 0 to 20 and Y is a range between Y=8E+18×exp (−0.03×X) and Y=4E+20×exp (−0.03×X), and
   the carbon concentration of the layer formed in contact with the second initial layer is lower than the carbon concentration of the second initial layer.

* * * * *